(12) United States Patent
Lee et al.

(10) Patent No.: US 10,020,263 B2
(45) Date of Patent: Jul. 10, 2018

(54) SEMICONDUCTOR PACKAGE AND MANUFACTURING METHOD THEREOF

(71) Applicant: Amkor Technology, Inc., Tempe, AZ (US)

(72) Inventors: Kyoung Yeon Lee, Seoul (KR); Tae Yong Lee, Gyeonggi-do (KR); Min Chul Shin, Bucheon-si (KR); Se Man Oh, Seoul (KR)

(73) Assignee: AMKOR TECHNOLOGY, INC., Tempe, AZ (US)

( * ) Notice: Subject to any disclaimer, the term of this patent is extended or adjusted under 35 U.S.C. 154(b) by 0 days.

(21) Appl. No.: 15/297,365

(22) Filed: Oct. 19, 2016

(65) Prior Publication Data

US 2017/0294412 A1 Oct. 12, 2017

(30) Foreign Application Priority Data

Apr. 7, 2016 (KR) .................. 10-2016-0042986

(51) Int. Cl.
*H01L 21/44* (2006.01)
*H01L 29/40* (2006.01)
*H01L 23/538* (2006.01)
*H01L 23/15* (2006.01)
*H01L 23/31* (2006.01)
*H01L 23/00* (2006.01)

(52) U.S. Cl.
CPC .......... *H01L 23/5384* (2013.01); *H01L 23/15* (2013.01); *H01L 23/31* (2013.01); *H01L 23/5389* (2013.01); *H01L 24/13* (2013.01); *H01L 24/16* (2013.01); *H01L 24/48* (2013.01); *H01L 24/81* (2013.01); *H01L 2224/131* (2013.01); *H01L 2224/13082* (2013.01); *H01L 2224/13147* (2013.01); *H01L 2224/16227* (2013.01); *H01L 2224/16238* (2013.01); *H01L 2224/48227* (2013.01); *H01L 2224/81203* (2013.01); *H01L 2224/81815* (2013.01); *H01L 2225/06517* (2013.01); *H01L 2225/06572* (2013.01); *H01L 2225/107* (2013.01); *H01L 2225/1058* (2013.01); *H01L 2924/1432* (2013.01); *H01L 2924/1433* (2013.01); *H01L 2924/14335* (2013.01); *H01L 2924/15311* (2013.01)

(58) Field of Classification Search
CPC .................................................. H01L 23/5384
USPC .................................. 257/774; 438/672, 675
See application file for complete search history.

(56) References Cited

U.S. PATENT DOCUMENTS

| 7,049,528 | B2 * | 5/2006 | Kariya | H01L 23/49811 174/250 |
| 9,036,362 | B2 * | 5/2015 | Tanaka | H05K 1/185 361/762 |
| 9,530,744 | B2 * | 12/2016 | Oi | H01L 24/13 25/105 |
| 2007/0164457 | A1 * | 7/2007 | Yamaguchi | H01L 23/5389 257/787 |

* cited by examiner

*Primary Examiner* — Calvin Lee
(74) *Attorney, Agent, or Firm* — McAndrews, Held & Malloy, Ltd.

(57) ABSTRACT

Provided are a semiconductor package and a manufacturing method thereof for securing a space for mounting a semiconductor device by etching a temporary metal plate to form a plurality of conductive posts.

20 Claims, 7 Drawing Sheets

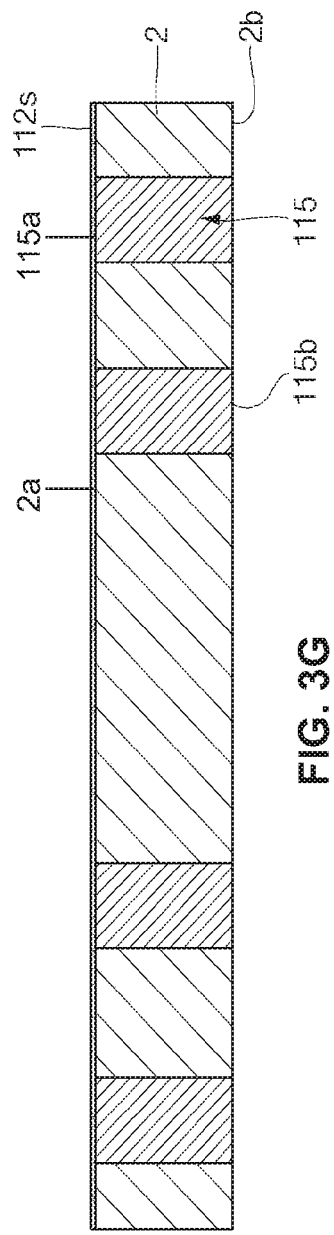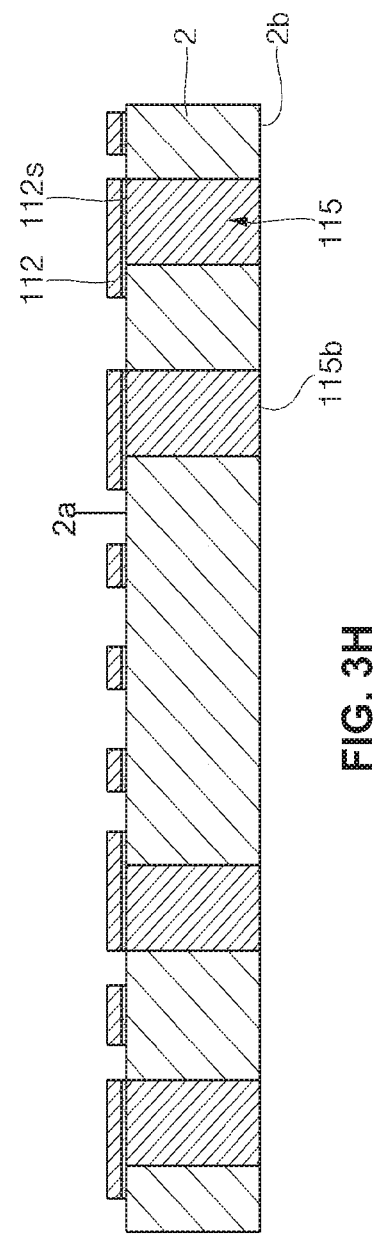

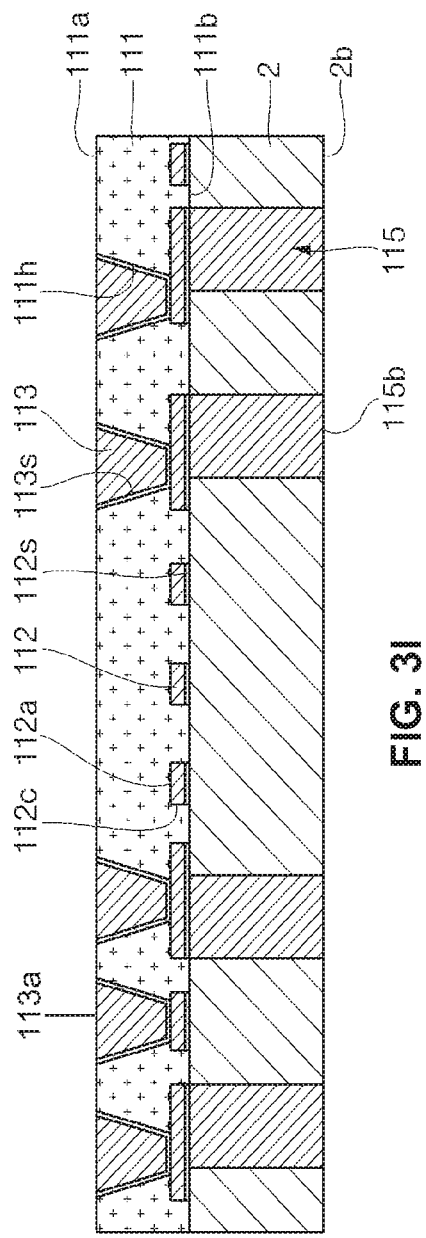
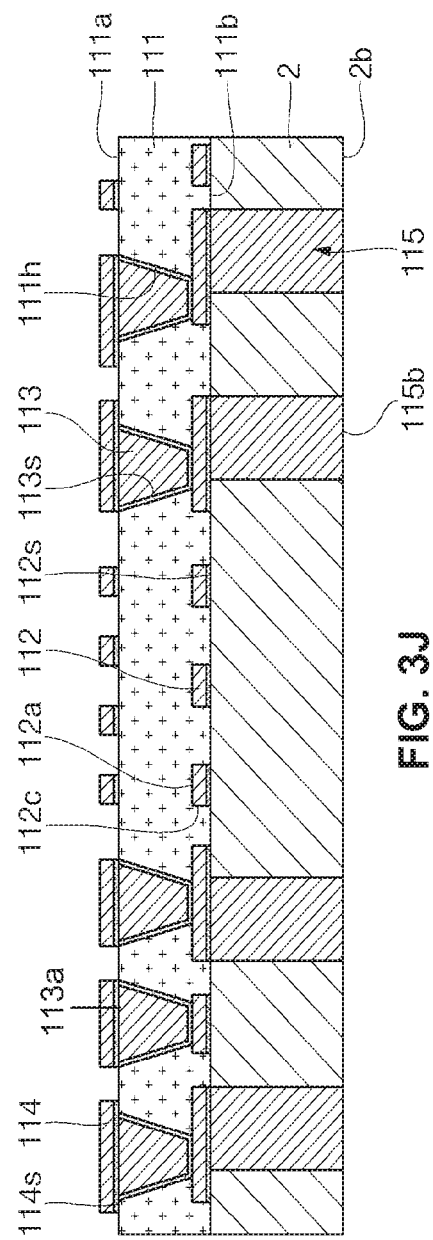
FIG. 3I
FIG. 3J

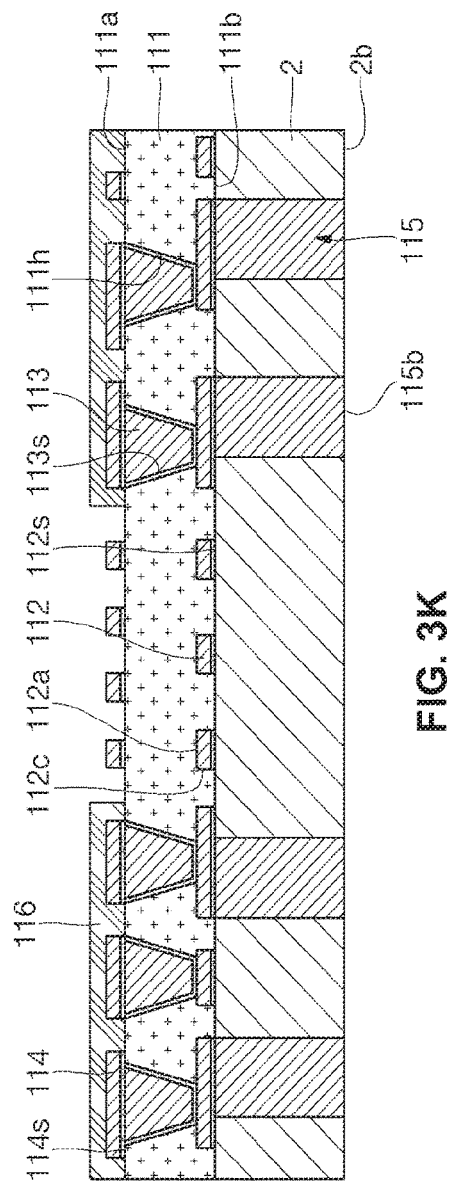
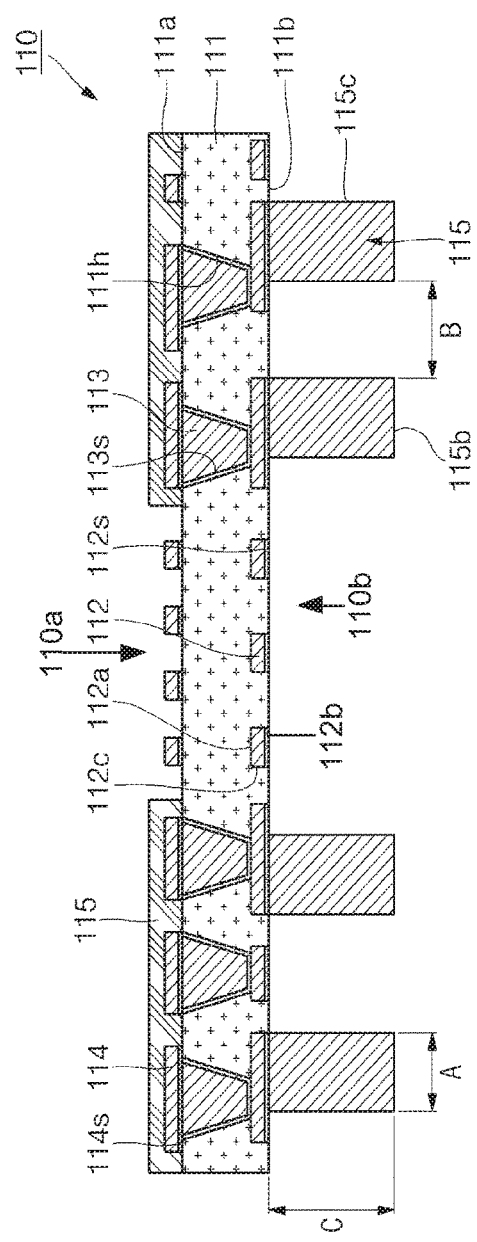

SEMICONDUCTOR PACKAGE AND MANUFACTURING METHOD THEREOF

CROSS-REFERENCE TO RELATED APPLICATIONS

The present application makes reference to, claims priority to, and claims the benefit of Korean Patent Application No. 10-2016-0042986, filed on Apr. 7, 2016, the contents of which are hereby incorporated herein by reference in its entirety.

BACKGROUND

Certain embodiments of the disclosure relate to a semiconductor package and a manufacturing method thereof.

With the increasing demand for miniaturization and high performance of electronic products in the semiconductor industry today, various techniques for providing high-capacity semiconductor packages are being researched and developed. In order to provide a high-capacity semiconductor package, many passive and/or active elements are integrated or stacked on a limited substrate, thereby achieving highly integrated semiconductor package.

Further limitations and disadvantages of conventional and traditional approaches will become apparent to one of skill in the art, through comparison of such systems with some aspects of the present disclosure as set forth in the remainder of the present application with reference to the drawings.

BRIEF SUMMARY

The present disclosure provides a semiconductor package and a manufacturing method thereof, which can secure a space for mounting a semiconductor device by forming a plurality of conductive posts on a temporary (or dummy) metal plate through etching.

The present disclosure also provides a semiconductor package and a manufacturing method thereof, which can reduce the cost and the process time for manufacturing conductive posts.

BRIEF DESCRIPTION OF SEVERAL VIEWS OF THE DRAWINGS

FIGS. 3A to 3L are cross-sectional views illustrating an example method of forming a substrate in the example semiconductor package manufacturing method illustrated in FIG. 2.

DETAILED DESCRIPTION

Figure 1:
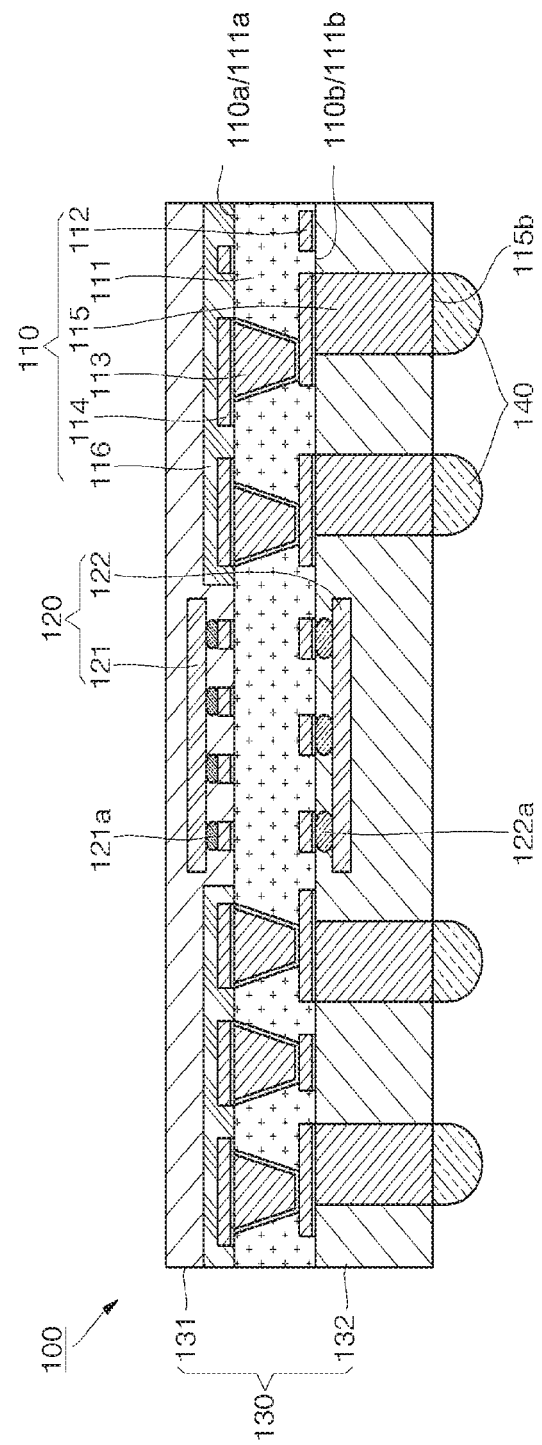
FIG. 1 is a cross-sectional view illustrating a semiconductor package according to an embodiment of the present disclosure.

Various aspects of the present disclosure may be embodied in many different forms and should not be construed as being limited to the example embodiments set forth herein. Rather, these example embodiments of the disclosure are provided so that this disclosure will be thorough and complete and will convey various aspects of the disclosure to those skilled in the art.

In the drawings, the thickness of layers and regions may be exaggerated for clarity. Here, like reference numerals refer to like elements throughout. As used herein, the term "and/or" includes any and all combinations of one or more of the associated listed items. In addition, the terminology used herein is for the purpose of describing particular embodiments only and is not intended to be limiting of the disclosure. As used herein, the singular forms are intended to include the plural forms as well, unless the context clearly indicates otherwise. It will be further understood that the terms "comprises," "comprising," "includes," and/or "including," when used in this specification, specify the presence of stated features, numbers, steps, operations, elements, and/or components, but do not preclude the presence or addition of one or more other features, numbers, steps, operations, elements, components, and/or groups thereof.

It will be understood that, although the terms first, second, etc. may be used herein to describe various members, elements, regions, layers and/or sections, these members, elements, regions, layers and/or sections should not be limited by these terms. These terms are only used to distinguish one member, element, region, layer, and/or section from another. Thus, for example, a first member, a first element, a first region, a first layer, and/or a first section discussed below could be termed a second member, a second element, a second region, a second layer, and/or a second section without departing from the teachings of the present disclosure. Reference will now be made in detail to the present embodiments of the present disclosure, examples of which are illustrated in the accompanying drawings.

According to an aspect of the present disclosure, there is provided a method of manufacturing a semiconductor package. The method comprises forming conductive posts by etching a metal plate, where, after etching, the conductive posts may be connected to a remaining planar portion of the metal plate. A filler may then be used to fill between the conductive posts, and after filling, the remaining planar portion of the metal plate may be removed, and a semiconductor die may be electrically connected to the conductive posts.

According to another aspect of the present disclosure, there is provided a method of manufacturing a semiconductor package, where the method comprises forming conductive posts by etching a metal plate. After etching, the conductive posts may be connected to a remaining planar portion of the metal plate, and a filler may be used to fill between the conductive posts. After filling, the remaining planar portion of the metal plate may be removed. Then first conductive patterns may be formed on a top surface of the filler and on top surfaces of the conductive posts, where one or more of the first conductive patterns may be electrically connected to a corresponding one or more of the conductive posts.

A dielectric layer may be formed that covers the filler, the conductive posts, and the first conductive patterns. Conductive vias may be formed that extend through the dielectric layer and connect to the first conductive patterns, second conductive patterns may be formed on a top surface of the dielectric layer, where the second conductive patterns may be electrically connected to the conductive vias. A first semiconductor die may be mounted on a top surface of the dielectric layer, with the first semiconductor die electrically connected to at least a portion of the second conductive patterns. A second semiconductor die may be mounted on a bottom surface of the dielectric layer, with the second semiconductor die electrically connected to at least a portion of the first conductive patterns.

Another aspect of the present disclosure provides a semiconductor package comprising a substrate that includes a dielectric layer, first conductive patterns at least partially embedded in the dielectric layer at a bottom surface of the dielectric layer, second conductive patterns formed on a top surface of the dielectric layer, conductive vias formed to electrically connect the first conductive patterns and the second conductive patterns, and conductive posts downwardly protruding from bottom surfaces of the first conductive patterns. At least one semiconductor device may be mounted on one or more of top surface and/or a bottom surface of the substrate, and an encapsulant may be formed on the substrate to entirely cover the semiconductor device(s).

As described above, in the semiconductor package and the manufacturing method thereof according to the present disclosure, since a plurality of conductive posts can be formed on a temporary (or dummy) metal plate through etching, the space for mounting a semiconductor device can be readily secured.

In addition, in the semiconductor package and the manufacturing method thereof according to the present disclosure, the cost and the process time for manufacturing conductive posts can be reduced.

Referring to FIG. 1, a cross-sectional view illustrating an example semiconductor package according to an embodiment of the present disclosure is illustrated.

As illustrated in FIG. 1, the semiconductor package 100 includes a substrate 110, one or more semiconductor devices 120 (e.g., a first semiconductor device 121, a second semiconductor device 122, etc.) electrically connected to the substrate 110, one or more encapsulants 130 (e.g., a first encapsulant portion 131, a second encapsulant portion 132, etc.) covering the semiconductor device(s) 120, and conductive bumps 140 electrically connected to the substrate 110.

The substrate 110 may include a dielectric layer 111 and a plurality of conductive vias 113 passing through or to a top surface 111*a* and/or a bottom surface 111*b* of the dielectric layer 111. In addition, the substrate 110 may further include a plurality of first conductive patterns 112 positioned on the bottom surface 111*b* of the dielectric layer 111 (e.g., embedded in the dielectric layer 111) and electrically connected to the plurality of conductive vias 113. In addition, the substrate 110 may further include a plurality of second conductive patterns 114 positioned on the top surface 111*a* of the dielectric layer 111 and electrically connected to the plurality of conductive vias 113. The substrate 110 may further include conductive posts 115 positioned on the bottom surface 111*b* of the dielectric layer 111 and electrically connected to the first conductive patterns 112. The conductive posts 115 may also be electrically connected to the conductive vias 113. Accordingly, the first and second semiconductor dies 121 and 122 may be electrically connected to the conductive posts 115.

The top surface 110*a* of the substrate 110 may be, for example, the same as the top surface 111*a* of the dielectric layer 111 and the bottom surface 110*b* of the substrate 110 may be, for example, the same as the bottom surface 111*b* of the dielectric layer 111.

Figure 2:
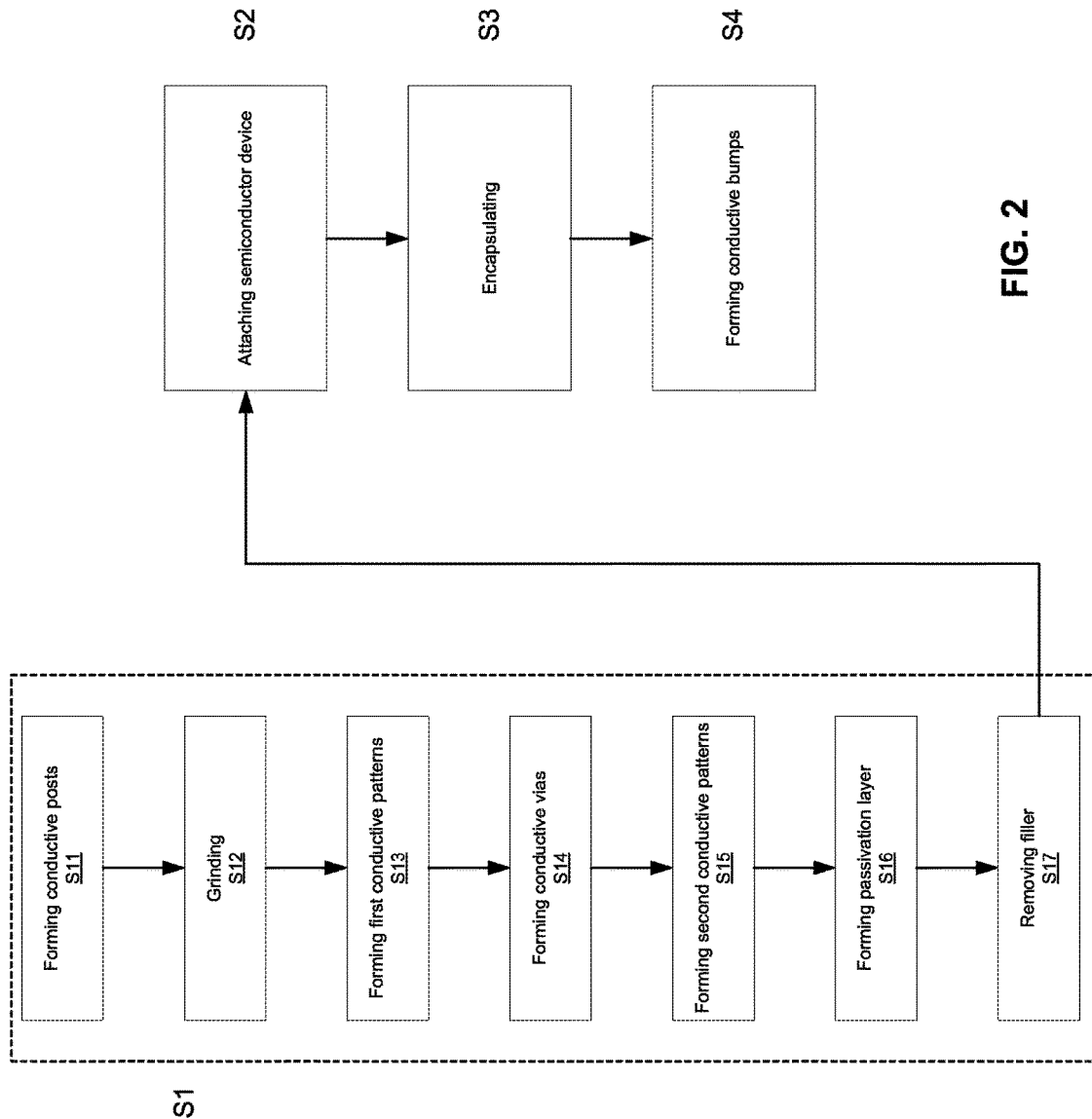
FIG. 2 is a flow diagram illustrating an example method of manufacturing the semiconductor package illustrated in FIG. 1.

Referring to FIG. 2 and FIGS. 3A to 3L, a flow diagram illustrating an example method of manufacturing the semiconductor package (100) of FIG. 1 and cross-sectional views illustrating an example method of forming a substrate (110) in the example method of manufacturing the semiconductor package of FIG. 2 are provided. Hereinafter, an example configuration and an example method of manufacturing the substrate 110 of the semiconductor package 100 will be described with reference to FIG. 2 and FIGS. 3A to 3L.

As illustrated in FIG. 2, the example method of manufacturing the semiconductor package 100 includes forming a substrate (S1), attaching (or mounting) a semiconductor device (S2), encapsulating (S3) and forming conductive bumps (S4). In addition, as illustrated in FIGS. 2 and 3A to 3L, the forming of the substrate (S1) includes forming conductive posts (S11), grinding (S12), forming first conductive patterns (S13), forming conductive vias (S14), forming second conductive patterns (S15), forming a passivation layer (S16) and removing a filler (S17).

Figure 3A:
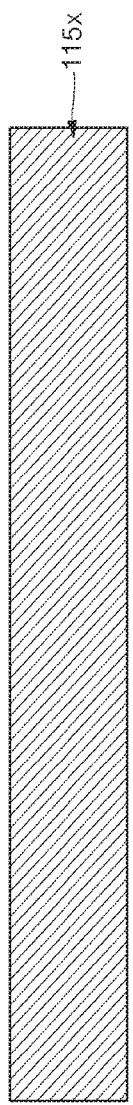
Figure 3B:
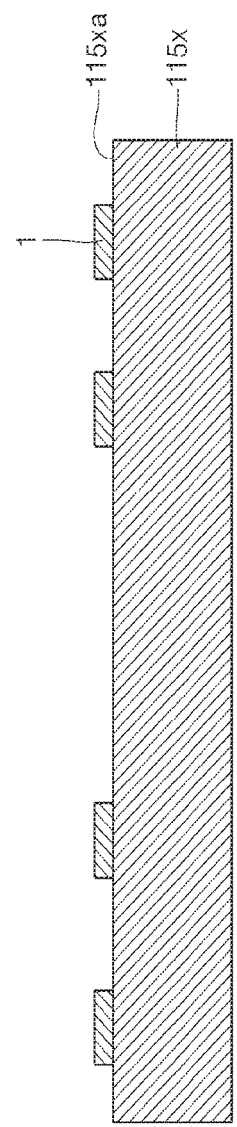
Figure 3C:
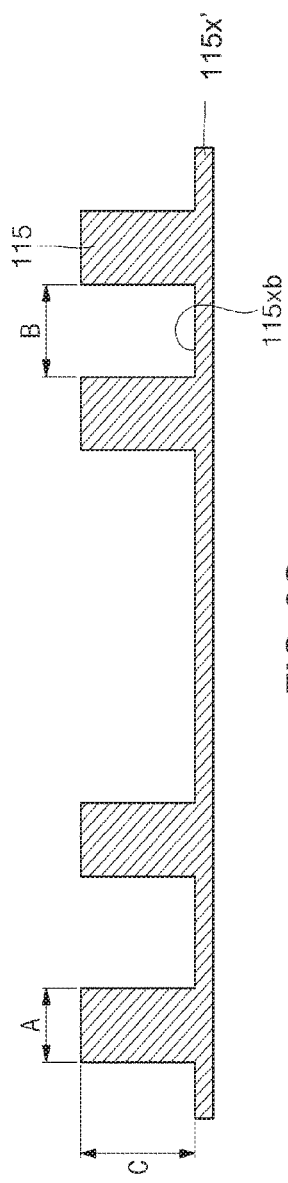

As illustrated in FIGS. 3A to 3C, in forming conductive posts (S11), a planar temporary (or dummy) metal plate 115*x* is prepared and a plurality of mask patterns 1 are then formed on a top surface 115*xa* of the temporary metal plate 115*x*. The temporary metal plate 115*x* not covered by the plurality of mask patterns 1 is removed to a predetermined depth. The areas of the temporary metal plate 115*x* covered by the mask patterns 1 thereby form the conductive posts 115. The conductive posts 115 may then be accessed when the mask patterns 1 are removed.

Accordingly, it can be seen that the conductive posts 115 may be formed by downwardly removing exposed portions of the temporary metal plate 115*x* that are not covered by the plurality of mask patterns 1. The removal of the exposed portions of the top surface 115*xa* of the temporary metal plate 115*x* may be, for example, via etching to a predetermined depth. Here, bottom portions of the conductive posts 115 may be connected to each other by the remaining portion 115*x*' of the temporary metal plate 115*x*. For example, the conductive posts 115 spaced apart from each other are on the top surface 115*xb* of the remaining portion 115*x*' that may be, for example, a planar or plate-shaped portion of the original temporary metal plate 115*x*. Though the conductive posts 115 and the remaining portion 115*x*' are both remaining portions of the original temporary metal plate 115*x*, they are discussed herein as separate entities.

A width A of each of the conductive posts 115 may be, for example, in the range of substantially between 200 µm and 450 µm, and a widthwise distance B between adjacent conductive posts 115 may be in the range of substantially between 90 µm and 500 µm, but aspects of the present disclosure are not limited thereto. In addition, a height C of each of the conductive posts 115 may be in the range of substantially between 60 µm and 100 µm, but aspects of the present disclosure are not limited thereto. When increasing at least one of the width A and the height C of each of the conductive posts 115, the widthwise distance B may also be increased. The width A and the height C of each of the conductive posts 115 may be varied so as to have one of the width A, the widthwise distance B and the height C according to the configuration and function of the semiconductor package 100. Note that since the conductive posts 115 are etched (e.g., from one side, etc.), each of the conductive posts 115 may have shape characteristics indicative of such etching. For example, the side surfaces of the conductive posts 115 may comprise asperities (or a rough texture) due to the etching. Also for example, the side surfaces of the conductive posts 115 may be sloped due to metal at a first end (or center portion) of the conductive posts 115 being exposed to the etchant for a longer period of time than metal at a second end of the conductive posts 115. For example, the conductive posts 115 may have an hour-glass (or snowman) shape, the shape of a truncated cone (or frustum), the shape of a truncated sphere bulging around the center, etc.

Since the conductive posts 115 are formed from the temporary metal plate 115x through etching, the processing cost and time may be reduced when compared to forming the conductive posts 115 through electroplating or electroless plating. Note that, although only one post etching step is presented herein, the masking and/or etching steps may be performed multiple times, for example, forming a stepped or multi-tiered structure.

After forming the conductive posts 115, the mask patterns 1 remaining on the conductive posts 115 may be removed (e.g., chemically stripped, etc.). The temporary metal plate 115x may be made of copper (Cu), but aspects of the present disclosure are not limited thereto. In addition, the mask patterns 1 may be made of photoresist, but aspects of the present disclosure are not limited thereto.

Figure 3D:
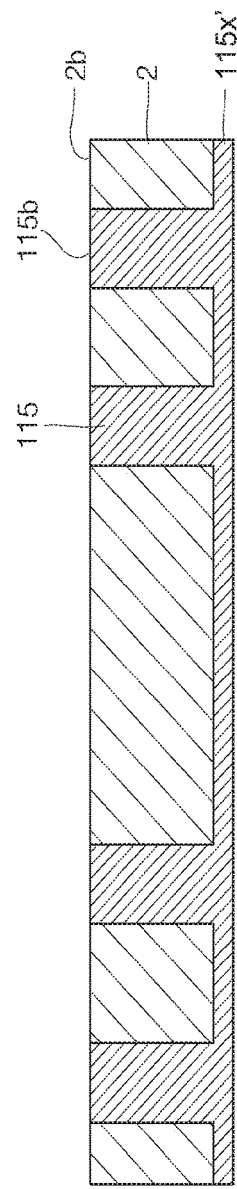
Figure 3E:
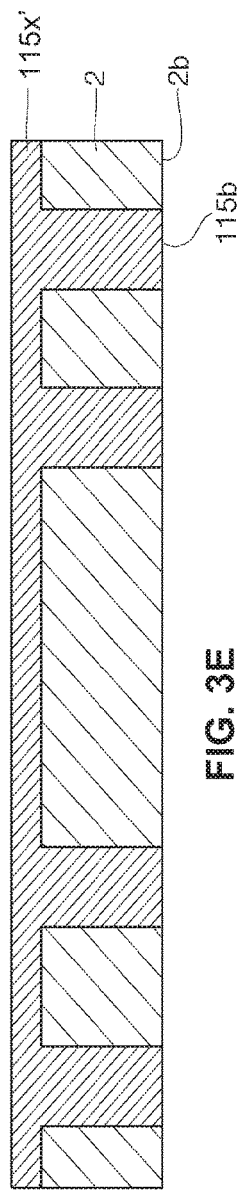
Figure 3F:
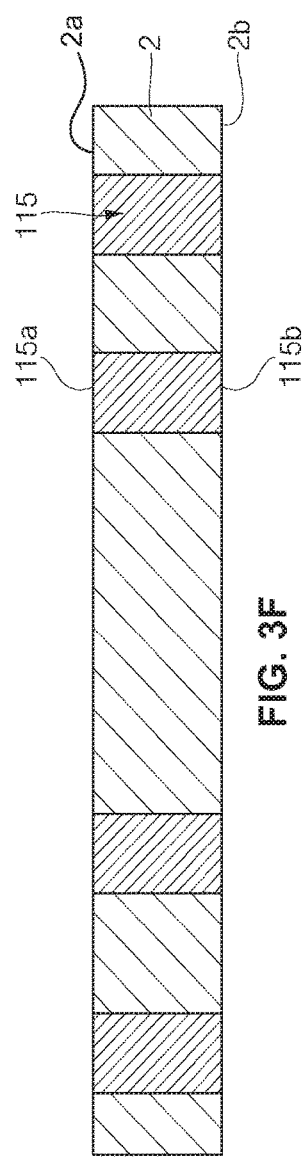

As illustrated in FIGS. 3D to 3F, in the grinding (S12), a filler 2 is formed to cover the etched top surface 115xb of the remaining portion 115x' having the conductive posts 115, and the remaining portion 115x' is removed.

First, as illustrated in FIG. 3D, the filler 2 may be formed to cover the etched top surface 115xb of the remaining temporary metal plate 115x, and fill the spaces between the conductive posts 115 to allow a top surface 2b of the filler 2 to be positioned to be as high as or to be higher than top surfaces 115b of the conductive posts 115. For example, the filler 2 may fill the space between each of the conductive posts 115 such that the top surface 2b of the filler 2 is as high as or higher than the top surfaces 115b of the conductive posts 115. The filler 2 may be made of an insulating material such as, for example, photoresist or epoxy, but aspects of the present disclosure are not limited thereto. The filler 2 may be formed in any of a variety of manners (e.g., spin coating, spraying, dipping, deposition, printing, molding, etc.).

As illustrated in FIG. 3E, after the filler 2 is formed the remaining temporary metal plate 115'x and conductive posts 115 are flipped to allow the remaining temporary metal plate 115x' to be positioned on the conductive posts 115 and the filler 2.

After being flipped, as illustrated in FIG. 3F, the remaining portion 115x' of the temporary metal plate 115x is removed (e.g., by mechanically grinding and/or chemical means, using laser for removal, using jets of fluid and/or gas for removal, etc.). In addition, when the remaining portion 115x' is removed, the respective surfaces 115a and 2a of the conductive posts 115 and the filler 2 are exposed to the outside. In addition, the surfaces 115a of the conductive posts 115 and the surface 2a of the filler 2, which are exposed to the outside by removing the temporary metal plate 115x, may be coplanar. The removal by grinding of the remaining portion 115x' may be performed using, for example, a diamond grinder or an equivalent thereof, but aspects of the present disclosure are not limited thereto.

As illustrated in FIGS. 3G and 3H, in the forming of first conductive patterns (S13), a first seed layer 112s made of a conductive material covers the surfaces 115a of the conductive posts 115 and the surface 2a of the filler 2, and the first conductive patterns 112 are formed on the first seed layer 112s through electroplating.

First, as illustrated in FIG. 3G, the first seed layer 112s may be formed to have a uniform thickness so as to cover the surfaces 115a of the conductive posts 115 and the surface 2a of the filler 2. The first seed layer 112s may include copper, titanium, or titanium tungsten, but aspects of the present disclosure are not limited thereto. The first seed layer 112s may be formed in any of a variety of manners (e.g., vapor deposition, electroless plating, etc.).

As illustrated in FIG. 3H, to form the first conductive patterns 112, a plurality of mask patterns (not shown) may be formed on regions of the first seed layer 112s covering those regions other than where the first conductive patterns 112 are to be formed. Such mask patterns may be formed, for example, utilizing photoresist, but aspects of the present disclosure are not limited thereto. The first conductive patterns 112 having a predetermined thickness may then be formed, for example, by electroplating the regions of the first seed layer 112s not covered by the mask patterns. Note that the first conductive patterns 112 (or conductive layer) may comprise any of a variety of materials (e.g., copper, aluminum, nickel, iron, silver, gold, titanium, chromium, tungsten, palladium, combinations thereof, alloys thereof, equivalents thereof, etc.), but the scope of the present disclosure is not limited thereto. Also note that the first conductive patterns 112 (or conductive layer) may be formed or deposited utilizing any one or more of a variety of processes (e.g., electrolytic plating, electroless plating, chemical vapor deposition (CVD), sputtering or physical vapor deposition (PVD), atomic layer deposition (ALD), plasma vapor deposition, printing, screen printing, lithography, etc.), but the scope of the present disclosure is not limited thereto.

After the first conductive patterns 112 are formed, the mask patterns remaining on the first seed layer 112s are removed (e.g., chemically stripped, etc.). In addition, after the mask patterns are removed, the first seed layer 112s in the regions where the first conductive patterns 112 are not formed may also be removed (e.g., by chemical etching, etc.) to expose the surface 2a of the filler 2 to the outside. For example, the first seed layer 112s and the first conductive patterns 112 may cover the same regions as shown in FIG. 3H. The first conductive patterns 112 may be electrically connected to the conductive posts 115 through the first seed layer 112s. In addition, the first seed layer 112s is a reference layer for forming the first conductive patterns 112 by electroplating, and, for ease of description, the following description will be made with regard to the first conductive patterns 112 as a single layer including the first seed layer 112s and the first conductive patterns 112. The first conductive patterns 112 may be made of copper (Cu), but aspects of the present disclosure are not limited thereto.

FIG. 3I illustrates forming the conductive vias (S14). The dielectric layer 111 may be formed to entirely cover the first conductive patterns 112 and the surface 2a of the filler 2, a plurality of via holes 111h exposing the plurality of first conductive patterns 112 to the outside may be formed, and a plurality of conductive vias 113 may be formed to fill the via holes 111h.

The dielectric layer 111 is formed to have a predetermined thickness to entirely cover the filler 2 and the first conductive patterns 112. The dielectric layer 111 may electrically insulate the first conductive patterns 112 and the first seed layer 112s. The first conductive patterns 112 may be configured such that their top and lateral surfaces 112a and 112c are covered by the dielectric layer 111. The dielectric layer 111 may be made from one or more of, for example, pre-preg, build-up film, silicon oxide film, silicon nitride film, mold compound, and equivalents thereof, but aspects of the present disclosure are not limited thereto. The dielectric layer may comprise one or more layers of any of a variety of dielectric materials such as, for example inorganic dielectric material (e.g., $Si_3N_4$, $SiO_2$, SiON, SiN, oxides, nitrides, combinations thereof, equivalents thereof, etc.) and/or organic dielectric material (e.g., a polymer, polyimide (PI), benzocyclobutene (BCB), polybenzoxazole (PBO), bismaleimide triazine (BT), a molding material, a phenolic resin, an epoxy, silicone, acrylate polymer, combinations thereof, equivalents thereof, etc.), but the scope of the present disclosure is not limited thereto. The dielectric layer 111 may be formed using any one or more of a variety of processes (e.g., spin coating, spray coating, printing, sintering, thermal oxidation, physical vapor deposition (PVD), chemical vapor deposition (CVD), metal organic chemical vapor deposition (MOCVD), atomic layer deposition (ALD), low pressure chemical vapor deposition (LPCVD), plasma enhanced chemical vapor deposition (PECVD), plasma vapor deposition (PVD), sheet lamination, evaporating, etc.), but the scope of the present disclosure is not limited thereto The plurality of via holes 111h are formed downwardly from the top surface 111a of the dielectric layer 111, thereby exposing the plurality of first conductive patterns 112 to the outside through the plurality of via holes 111h. The plurality of conductive vias 113 are formed to be electrically connected to the first conductive patterns 112 by filling the plurality of via holes 111h. The via holes 111h may be formed in any of a variety of manners (e.g., laser ablation, mechanical ablation or drilling, chemical etching, etc.).

The plurality of conductive vias 113 may be formed to fill the via holes 111h by electroplating the plurality of first conductive patterns 112 exposed to the outside through the plurality of via holes 111h. For example, the conductive vias 113 may be formed to fill the via holes 111h by electroplating using the first conductive patterns 112 as a seed layer. In addition, the conductive vias 113 may be formed by forming a via seed layer 113s on inner walls of the via holes 111h and the first conductive patterns 112 and performing electroplating on the via seed layer 113s. As described above, the conductive vias 113 may use the first conductive patterns 112 as a seed layer or have a separate via seed layer 113s as a reference layer for electroplating, but aspects of the present disclosure are not limited thereto. The via seed layer 113s may include, for example, copper, titanium, or titanium tungsten, but aspects of the present disclosure are not limited thereto. Note that the via holes 111h may be filled in any of a variety of manners (e.g., electroplating, electroless plating, printing, pasting, etc.).

FIG. 3J illustrates forming of second conductive patterns (S15). The plurality of second conductive patterns 114 are formed on the dielectric layer 111 and the top surfaces of the conductive vias 113 to electrically connect to the conductive vias 113.

The second conductive patterns 114 may be formed in the same manner as the first conductive patterns 112. For example, the second conductive patterns 114 may be formed by forming a second seed layer 114s to entirely cover the top surface 111a of the dielectric layer 111 and the top surfaces 113a of the conductive vias 113. Mask patterns may then be formed on regions of the second seed layer 114s, exposing the regions where the second conductive patterns 114 are to be formed, and performing electroplating on the second seed layer 114s. The second seed layer 114s may be, for example, a copper layer, a titanium layer, or a titanium tungsten layer, and the second conductive patterns 114 may include copper, but aspects of the present disclosure are not limited thereto. In addition, the second seed layer 114s may be a reference layer for forming the second conductive patterns 114 by electroplating, and for ease of description, the following description will be made with regard to the second conductive patterns 114 as a single layer including the second seed layer 114s and the second conductive patterns 114.

The second conductive patterns 114 formed on the top surface 111a of the dielectric layer 111 and the top surface 113a of the conductive vias 113 may be electrically connected to the first conductive patterns 112 through the conductive vias 113.

As illustrated in FIG. 3K, in the forming of passivation layer (S16), a passivation layer 116 (or dielectric layer) is formed to cover the top surface 111a of the dielectric layer 111 and the second conductive patterns 114. For example, at least one of the second conductive patterns 114 may be exposed to the outside of the passivation layer 116. For example, the second conductive pattern(s) 114 may each be exposed through a respective opening in the passivation layer 116 and/or a plurality of the second conductive patterns 114 may be exposed through a single opening in the passivation layer. The second conductive pattern(s) 114 exposed to the outside may be electrically connected to the semiconductor device 121 as shown in FIG. 1. Note that the passivation layer 116 may be formed of any of the materials described herein with regard to the dielectric layer 111 and/or may be formed utilizing any of the methods discussed herein with regard to the dielectric layer 111.

In an embodiment, among the plurality of second conductive patterns 114, the second conductive patterns 114 in the central region of the top surface 110a of the substrate 110 may be exposed to the outside (e.g., through one or more openings in the passivation layer 116), and the second conductive patterns 114 in the peripheral region of the top surface 110a of the substrate 110 may be covered by the passivation layer 116.

As illustrated in FIG. 3L, in the removing of the filler (S17), the filler 2 is removed to expose the bottom surface 111b of the dielectric layer 111 and the first conductive patterns 112 (e.g., those portions of the conductive patterns 112 not covered by the conductive posts 115) to the outside. Here, when the filler 2 is removed, the lateral surfaces 115c of the conductive posts 115 may be exposed to the outside. Accordingly, as shown in FIG. 3L, the substrate 110 (or a portion thereof) may be formed by removing the filler 2. The substrate 110 may be provided, for example, such that the conductive posts 115 spaced apart from each other are brought into contact with and electrically connected to the bottom surfaces 112b of the first conductive patterns 112 and are downwardly protruded.

In addition, the first conductive patterns 112 exposed to the outside when the filler 2 is removed become patterns to be electrically connected to the semiconductor device 122. Among the first conductive patterns 112, the first conductive patterns 112 in the central region of the bottom surface 110b of the substrate 110 may be exposed to the outside, and the first conductive patterns 112 in the peripheral region of the bottom surface 110b of the substrate 110 may be electrically connected to the conductive posts 115.

Referring to FIGS. 1 and 3L, in the mounting of the semiconductor device (S2), at least one semiconductor device 120 is mounted to be electrically connected to the second conductive patterns 114 and/or the first conductive patterns 112, which are exposed at the top surface 110a or the bottom surface 110b of the substrate 110, respectively. For example, one or more semiconductor devices 120 may be mounted on the top surface 110a of the substrate 110 (e.g., at least a first semiconductor device 121) to be electrically connected to the second conductive patterns 114 of the substrate 110, on the bottom surface 110b of the substrate 110 (e.g., at least a second semiconductor device 122) to be electrically connected to the first conductive patterns 112 of the substrate 110, or on both of the top surface 110a and the bottom surface 110b of the substrate 110.

For example, in the mounting of the semiconductor device (S2), at least one first semiconductor device 121 may be mounted on the top surface 110a of the substrate 110 to be electrically connected to the second conductive patterns 114 exposed to the top surface 110a of the substrate 110, and at least one second semiconductor device 122 may be mounted on the bottom surface 110b of the substrate 110 to be electrically connected to the first conductive patterns 112 exposed to the bottom surface 110b of the substrate 110. The second semiconductor device 122 may be mounted on the central region of the bottom surface 110b of the substrate 110 and the conductive posts 115 may be downwardly protruded in the peripheral region of the bottom surface 110b of the substrate 110. For example, a vertical space large enough to mount the second semiconductor device 122 on the bottom surface 110b of the substrate 110 can be secured by the height C of each of the conductive posts 115.

The first semiconductor device 121 may be a flip chip type semiconductor die and may be electrically connected to the second conductive patterns 114 of the substrate 110 through, for example, micro bumps 121a. In addition, the second semiconductor device 122 may be a flip chip type semiconductor die and may be electrically connected to the first conductive patterns 112 of the substrate 110 through, for example, micro bumps 122a. The micro bumps 121a and 122a may include, for example, conductive balls such as solder balls, conductive pillars such as copper pillars, and/or conductive posts having solder caps formed on copper pillars. In addition, the semiconductor devices 120 including bond pads may be electrically connected to the first conductive patterns 112 or the second conductive patterns 114 of the substrate 110 through wire bonding. However, the present disclosure does not limit the connection relationship between each of the semiconductor devices 120 and the conductive patterns 112 and 114 to that disclosed herein. The semiconductor devices 120 may be electrically connected to the substrate 110 by, for example, a mass reflow process, a thermal compression process, and/or a laser bonding process. In addition, the semiconductor devices 120 may further include semiconductor devices provided in a vertical direction.

Moreover, the semiconductor devices 120 may include an integrated circuit chip separated from a semiconductor wafer. The semiconductor devices 120 may include, for example, electric circuits, such as central processing units (CPUs), digital signal processors (DSPs), network processors, power management units, audio processors, radio frequency (RF) circuits, wireless baseband system on chip (SoC) processors, sensors, application-specific integrated circuits (ASICs). In addition, the semiconductor devices 120 may be a device such as a resistor, a capacitor, an inductor, or a connector, but aspects of the present disclosure are not limited thereto. Furthermore, the semiconductor devices 120 may comprise other packages that have chips, such as, for example, BGA packages, leadframe packages, etc.

In the encapsulating (S3), as shown in FIG. 1, an encapsulant 130 is formed to cover (e.g., partially cover, completely cover, etc.) the top surface 110a and the bottom surface 110b of the substrate 110. In the encapsulating (S3), a first encapsulant 131 may be formed to cover the top surface 110a of the substrate 110 and the first semiconductor device 121, and a second encapsulant 132 may be formed to entirely cover the bottom surface 110b of the substrate 110 and the second semiconductor device 122. When the second encapsulant 132 is formed, the bottom surfaces 115b of the conductive posts 115 may be exposed to the outside.

The encapsulant 130 may be formed to encapsulate the semiconductor devices 120 and all surfaces on the substrate 110 except for the bottom surfaces 115b of the conductive posts 115, thereby protecting the semiconductor device 120 from external mechanical/electrical/chemical contaminants or impacts. Note that the encapsulant 130 may also be formed to expose at least a top surface of any one or more of the semiconductor devices 120.

The first encapsulant 131 and the second encapsulant 132 may be simultaneously formed using a mold and a molding frame, but aspects of the present disclosure are not limited thereto. The first encapsulant 131 and/or the second encapsulant 132 may comprise one or more of, for example, pre-preg, build-up film, silicon oxide film, silicon nitride film, mold compound, and equivalents thereof, but aspects of the present disclosure are not limited thereto.

In addition, the first encapsulant 131 of the encapsulant 130 may be formed to entirely cover the first semiconductor device 121 and the top surface 110a of the substrate 110 after the first semiconductor device 121 is mounted on the top surface 110a of the substrate 110, and the second encapsulant 132 may be formed to entirely cover the second semiconductor device 122 and the bottom surface 110b of the substrate 110 after the second semiconductor device 122 is mounted on the bottom surface 110b of the substrate 110. The mounting of the semiconductor device 120 and the forming of the encapsulant 130 may also be performed in a reverse order.

The encapsulant 130 (or encapsulating material) may include, for example, polyimide (PI), benzocyclobutane (BCB), polybenzoxazole (PBO), bismaleimide triazine (BT), phenolic resin, and epoxy, but aspects of the present disclosure are not limited thereto. For example, the encapsulating material may comprise any of a variety of encapsulating or molding materials (e.g., resin, polymer, polymer composite material, polymer with filler, epoxy resin, epoxy resin with filler, epoxy acrylate with filler, silicone resin, combinations thereof, equivalents thereof, etc.). The encapsulant 130 (or encapsulating material) may be formed in any of a variety of manners (e.g., compression molding, transfer molding, liquid encapsulant molding, vacuum lamination, paste printing, film assisted molding, etc.).

In the forming of conductive bumps (S4), conductive bumps 140 are formed on the bottom surfaces 115b of the conductive posts 115 to allow electrical connection of the conductive posts 115 to outside of the encapsulant 130. The conductive bumps 140 may serve as input and/or output connections for mounting the semiconductor package 100 on an external board of an electronic device. The conductive bumps 140 may be, for example, conductive pillars, copper pillars, conductive balls, solder balls or copper balls, but aspects of the present disclosure are not limited thereto.

Since various aspects of the semiconductor package 100 manufactured by the aforementioned example manufacturing method are formed by etching the temporary metal plate 115x to form the conductive posts 115, it is efficient to secure a space for mounting the semiconductor devices 120, and the processing cost and time can be reduced compared to a case where the conductive posts 115 are stacked through plating.

Additionally, while the encapsulant 130 may be as described, various embodiments of the disclosure may, for example, optionally not have an encapsulant, or a filler material may be used again. For example, all or only a portion of the filler 2 may be removed, and after the second semiconductor device 122 is attached to the first conductive pattern 112, the second semiconductor device 122 may not be covered. Or, it may be covered using a filler material or encapsulating material. Accordingly, it can be seen that the present encapsulant 132 may be removed in whole or in part, and if removed, the same type of encapsulant material may be used or another type of material may be used to cover the second semiconductor device 122 or in varying degrees up to the volume that the filler 2 occupied before being removed. Therefore, an embodiment covering the second semiconductor device 122 may look as shown in FIG. 1, occupy some portion of the volume occupied by the encapsulant 132, or the volume shown occupied by the encapsulant 132 is not filled with anything.

While the semiconductor package and the manufacturing method thereof according to various aspects of the present disclosure have been described with reference to certain supporting embodiments, it will be understood by those skilled in the art that the present disclosure not be limited to the particular embodiments disclosed, but that the present disclosure will include all embodiments falling within the scope of the appended claims.

What is claimed:

1. A method of manufacturing a semiconductor package, the method comprising:
   forming conductive posts by etching a metal plate, wherein after said etching, the conductive posts are connected to a remaining planar portion of the metal plate;
   filling between the conductive posts with a filler;
   removing the remaining planar portion of the metal plate;
   forming first conductive patterns on a top surface of the filler and on top surfaces of the conductive posts, wherein one or more of the first conductive patterns are electrically connected to corresponding one or more of the conductive posts;
   forming a dielectric layer that covers the filler, the conductive posts, and the first conductive patterns;
   forming conductive vias that extend through the dielectric layer and connect to the first conductive patterns;
   forming second conductive patterns on a top surface of the dielectric layer, wherein the second conductive patterns are electrically connected to the conductive vias; and
   at least one of:
      mounting a first semiconductor die on a top surface of the dielectric layer to electrically connect the first semiconductor die to at least a portion of the second conductive patterns; or
      mounting a second semiconductor die on a bottom surface of the dielectric layer to electrically connect the second semiconductor die to at least a portion of the first conductive patterns.

2. The method of claim 1, wherein the second semiconductor die is mounted on the bottom surface of the dielectric layer to electrically connect the second semiconductor die to the at least a portion of the first conductive patterns.

3. The method of claim 1, wherein the first semiconductor die is mounted on the top surface of the dielectric layer to electrically connect the first semiconductor die to the at least a portion of the second conductive patterns.

4. The method of claim 1, wherein a height between top and bottom surfaces of each of the conductive posts ranges from substantially 60 µm to substantially 100 µm.

5. The method of claim 1, wherein a distance between adjacent ones of the conductive posts ranges from substantially 90 µm to substantially 500 µm.

6. The method of claim 1, wherein a width of each of the conductive posts ranges from substantially 200 µm to substantially 450 µm.

7. The method of claim 1, comprising removing the filler to expose a portion of the first conductive patterns, side surfaces of the conductive posts, and a portion of the first dielectric layer.

8. The method of claim 7, comprising covering the exposed portion of the first conductive patterns, the exposed side surfaces of the conductive posts, the exposed portion of the first dielectric layer, and a portion of the second semiconductor die with an encapsulating material.

9. The method of claim 1, comprising covering at least a portion of the first semiconductor die in a first encapsulating material.

10. The method of claim 9, comprising covering at least a portion of the second semiconductor die in a second encapsulating material separate from the first encapsulating material.

11. A method for manufacturing a semiconductor package, the method comprising:
   forming conductive posts from a metal plate, wherein the conductive posts are joined at their bottom portions by a portion of the metal plate;
   surrounding the conductive posts with an insulating layer;
   removing the portion of the metal plate;
   forming first conductive patterns on the insulating layer and the conductive posts to electrically connect at least a portion of the first conductive patterns to a corresponding one of each of the conductive posts;
   forming a dielectric layer over the first conductive patterns, the insulating layer, and the conductive posts;
   forming conductive vias through the dielectric layer to electrically connect to at least a portion of the first conductive patterns;
   forming second conductive patterns on the dielectric layer and the conductive vias to electrically connect at least a portion of the second conductive patterns to a corresponding one of each of the conductive vias;
   removing the insulating layer to expose at least a portion of the dielectric layer and at least a portion of the first conductive patterns;
   mounting at least one semiconductor device to one or both of a top surface of the dielectric layer and a bottom surface of the dielectric layer; and
   covering entirely, with an encapsulant, the at least one semiconductor device.

12. The method according to claim 11, wherein mounting the at least one semiconductor device includes mounting a semiconductor device on the bottom surface of the dielectric layer to couple the semiconductor device to at least a part of the first conductive patterns.

13. The method according to claim 11, wherein mounting the at least one semiconductor device includes mounting a semiconductor device on the top surface of the dielectric layer to couple the semiconductor device to at least a part of the second conductive patterns.

14. The method according to claim 11, wherein a height between top and bottom surfaces of each of the conductive posts ranges from substantially 60 µm to substantially 100 µm.

15. The method according to claim 11, wherein a distance between adjacent ones of the conductive posts ranges from substantially 90 µm to substantially 500 µm.

16. The method according to claim 11, wherein a width of each of the conductive posts ranges from substantially 200 µm to substantially 450 µm.

17. The method according to claim 11, wherein mounting the at least one semiconductor device includes:
  mounting a first semiconductor device on the top surface of the dielectric layer to be electrically connected to the second conductive patterns, and
  mounting a second semiconductor device on the bottom surface of the dielectric layer to be electrically connected to the first conductive patterns.

18. The method according to claim 17, comprising electrically connecting a plurality of conductive bumps to bottom surfaces of the conductive posts.

19. The method according to claim 17, comprising:
  electrically connecting the second semiconductor device to the first conductive patterns in a central region of the bottom surface of the dielectric layer; and
  electrically connecting the conductive posts to the first conductive patterns in a peripheral region of the bottom surface of the dielectric layer.

20. The method according to claim 19, wherein covering entirely, with the encapsulant, comprises:
  covering, with a first encapsulant, at least the first semiconductor device and the top surface of the dielectric layer; and
  covering, with a second encapsulant, at least the second semiconductor device and the bottom surface of the dielectric layer while leaving exposed bottom surfaces of the conductive posts to the outside.

* * * * *